United States Patent
Torii

(10) Patent No.: US 7,764,546 B2
(45) Date of Patent: Jul. 27, 2010

(54) METHOD AND ARCHITECTURE FOR FAST FLASH MEMORY PROGRAMMING

(75) Inventor: Satoshi Torii, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/405,947

(22) Filed: Mar. 17, 2009

(65) Prior Publication Data
US 2009/0175088 A1    Jul. 9, 2009

Related U.S. Application Data

(62) Division of application No. 11/504,254, filed on Aug. 14, 2006, now Pat. No. 7,505,328.

(51) Int. Cl.
*G11C 16/00*    (2006.01)

(52) U.S. Cl. .................. 365/185.12; 365/185.02; 365/185.11

(58) Field of Classification Search ............. 365/185.02
See application file for complete search history.

(56) References Cited

U.S. PATENT DOCUMENTS

| | | |
|---|---|---|
| 5,027,321 A | 6/1991 | Park |
| 5,355,347 A | 10/1994 | Cioaca |
| 5,418,752 A * | 5/1995 | Harari et al. ............... 365/218 |
| 5,781,478 A * | 7/1998 | Takeuchi et al. ......... 365/185.11 |
| 6,094,368 A * | 7/2000 | Ching ..................... 365/49.15 |
| 6,219,280 B1 * | 4/2001 | Naganawa ............. 365/185.22 |
| 6,370,059 B2 * | 4/2002 | Kato et al. ............. 365/185.11 |
| 6,434,043 B2 | 8/2002 | Masuoka |
| 6,567,307 B1 * | 5/2003 | Estakhri ............... 365/185.11 |
| 6,631,089 B1 | 10/2003 | Ogura et al. |
| 6,717,846 B1 | 4/2004 | Lee et al. |
| 7,133,317 B2 | 11/2006 | Liao et al. |
| 7,512,733 B2 * | 3/2009 | Nakamura et al. ......... 711/103 |
| 2007/0189073 A1 | 8/2007 | Aritome |

* cited by examiner

*Primary Examiner*—Tan T. Nguyen

(57) ABSTRACT

Embodiments of the present invention disclose a method of utilizing a flash memory array to decrease programming time while maintaining sufficient read speeds. An array of cells is programmed and read in pages that are oriented in the column direction, parallel to the bit lines in the array. An erased cell in the present invention is a cell in the "off" state. According to the present invention a cell is programmed by lowering the threshold voltage of the cell, thereby turning the cell "on." An array of cells is programmed read in a sector-by-sector method, wherein a sector consists of units situated diagonally adjacent to each other, and a unit consists of multiple parallel column-oriented pages.

9 Claims, 9 Drawing Sheets

METHOD AND ARCHITECTURE FOR FAST FLASH MEMORY PROGRAMMING

RELATED U.S. APPLICATION

This application is a continuation (divisional) application of the U.S. patent application Ser. No. 11/504,254, filed Aug. 14, 2006, by S. Torii, and entitled "Method and Architecture for Fast Flash Memory Programming," U.S. Pat. No. 7,505, 328, hereby incorporated by reference in entirety.

TECHNICAL FIELD

The present invention relates to the field of microelectronic integrated circuits. Specifically, the present invention relates to flash memory devices.

BACKGROUND

A flash memory device utilizes an array of flash memory cells to store data. Prior Art FIG. 1 is a cutaway view of a typical flash memory cell 100, consisting of a control gate 101, a charge trapping layer 102, e.g. an oxide-nitride-oxide (ONO) stack, an oxide film 103, a channel region 104, and doped regions 105a and 105b. One of the doped regions 105a can be designated as the source for the cell, and the other doped region 105b can be designated as the drain for the cell. The role of the doped regions 105a and 105b (source or drain) is interchangeable depending on the outcome desired. The control gate 101, floating gate 102 and oxide film 103 are stacked on top of the substrate 106, while the channel 104 and doped regions 105a and 105b are situated within the substrate. The control gates 101 of flash memory cells 100 in a row are connected by a word line 110.

Prior Art FIG. 2 is diagram of a conventional array of flash memory cells. The memory cells 100 in a row 215 in the array 200 are connected by a word line 110, and the word lines 110 are controlled by a word line driver 211. Columns 225 of memory cells 100 in the array 200 are also accessed by bit lines 220. The bit lines 220 are controlled by a bit line driver 221. Each bit line 220 is shared by two adjacent columns 225 of memory cells 100 in the array 200.

In single bit flash memory architecture, each memory cell 100 can represent two states: binary 1 or binary 0. Referring to Prior Art FIG. 1, if a cell 100 is "turned on," current can flow through the channel 104, and the cell reads as "1." If the cell 100 is "turned off," a read current cannot flow through the channel, and the cell reads as "0." Single bit flash memory cells store 1 bit per cell. Programming of a flash memory array 200 begins with every cell in the same state, either 1 or 0. If all cells 100 are initially in the 1 state, in other words all cells 100 in the array 200 are turned on, programming consists of changing selected cells to the 0 state, i.e. turning them off. Conversely, if all cells are initially in the 0 state (turned off), programming consists of changing selected cells to the 1 state (turning selected cells on). A read operation can then be performed on the array to mine the binary data from the array of cells. Before the next program operation, the flash memory cells are erased, or returned to their initial state, and programming begins again. Flash memory cells can be programmed (written) and erased repeatedly during the lifetime of the flash memory device.

Referring back to Prior Art FIG. 1, to read a single bit flash memory cell 100, a read voltage (e.g. 3V) is applied to the control gate 101 via the word line 110, a secondary voltage (e.g. 1.4V) is applied to the drain 105b, and the source 105a is grounded. The resulting current flowing from the source 105a to the drain 105b through the channel 104 is measured and compared to a reference current. If the measured current is above the reference current, the cell reads as "1," and if the measured current is below the reference current, the cell reads as "0."

Still referring to Prior Art FIG. 1, to create the "0" state of a single bit cell 100, the threshold voltage of the cell is raised by applying a high positive voltage (e.g. 9V) to the control gate 101, a positive voltage (e.g. 5V) to the drain 105a, and grounding the source 105b. The voltage potential of this configuration excites electrons in the channel 104 to accumulate near the drain 105a and then pierce the oxide film 103 and get trapped in the charge trapping layer 102 of the cell. The electrons remain trapped in the charge trapping layer 102 even after the high voltage is no longer applied to the control gate 101. When a read operation is performed on a cell in this state, the cell reads as "0." In other words, the measured current through the channel 104 is less than the reference current.

Still referring to FIG. 1, to create the "1" state of a single bit cell, in other words to turn on a cell that is off, the threshold voltage of the cell 100 is lowered by applying a low or negative voltage (e.g. −6V) to the control gate 101 and a positive voltage (e.g. 5V) to the source 105a and the drain 105b. The voltage potential of this configuration forces electrons to tunnel through the oxide film 103 and down into the substrate 106. When a read operation is performed on a cell 100 in this state, the cell 100 reads as "1." In other words, the measured current through the channel 104 is greater than the reference current.

Typically, when electrons are trapped in the floating gate 102 of a flash memory cell 100, they tend to remain on the side of the floating gate 102 above the drain (e.g. 105b) of the cell 100. Due to this phenomenon, it is possible to store two bits of information in a flash memory cell 100 in what is called dual bit, or mirror bit flash memory.

Referring now to Prior Art FIG. 3A, the threshold voltage of a cell 100 is raised by applying a high voltage (9V) to the control gate 101 via the word line 110, designating the left doped region 105a as the source and grounding it, and designating the right doped region 105b as the drain and applying a positive voltage (5V) to the drain 105b. Electrons 301 are trapped in the right side of the charge trapping layer 102. Subsequently, as depicted in Prior Art FIG. 3B the source and drain regions can be reversed, e.g. the left doped region 105a designated as the drain and given the positive voltage (5V) and the right doped region 105b designated as the source and grounded. Consequently, electrons 302 are trapped on the left side of the floating gate 102.

When a read operation is performed on a dual bit flash memory cell 100, there are four possible states that can be represented. If there are no electrons trapped in the floating gate 102, the threshold voltage of the cell 100 is at its minimum, the measured current is at its maximum, and the cell is read as "11." If there are electrons (301, 302) trapped in one side of the floating gate 102 but not the other, the cell reads as either "01" or "10." The measured current through a "01" cell is distinct from the measured current through a "10" cell. If electrons (301 and 302) are trapped on both sides of the floating gate 102, the threshold voltage is at its maximum, the measured current is at its minimum, and the cell 100 reads as "11."

When operations are performed on one cell 100, the states of neighboring cells 100 tend to be disturbed. For example, when the threshold voltage of cell A 230 is raised to the desired level, the threshold voltage of neighboring cell B 240 along the row 216 might inadvertently raise. This disturbance leads to read and write errors. Dual bit cells are especially susceptible to disturbance, as there are four possible threshold voltage distributions that must be distinct and separate from one another. Conventional flash memory methods incorporate remedies for inhibiting or preventing disturb on neighboring cells.

A conventional method of flash memory programming consists of starting with an array 200 of cells 100 in the "1" state in a single bit architecture or "11" in a dual bit architecture, designated as the "erased" state. In other words, in an erased array 200, according to conventional methods, the cells are turned on. Selected cells are programmed by raising the threshold voltages of the selected, so that selected cells read as "0" in single bit architecture or "01," "10," or "00" in dual bit architecture.

A page 250, depicted in Prior Art FIG. 2, in flash memory is the amount of flash memory cells 100 that can be programmed at once. Writing, or programming a cell 100 requires a certain current. Page size is dictated by the maximum current that can be applied to the array 200 at one time, and how many bits can be programmed with that current. According to conventional methods of flash memory, pages 250 are typically oriented in the row direction. In other words, cells 100 are programmed row by row. A high voltage is applied to the control gates 101 of a row 215 of cells 100 via the word line 110 connecting these cells 100, and voltages are applied to the bit lines 220 as required to raise the threshold voltage on each cell 100 by the desired amount, thereby programming selected cells in the page 250. In this scenario, approximately 250 µA is required to program a dual bit cell, and a typical page size is 8 bits, programmed at a rate of approximately 5 µsecs per page (0.20 kB/msec).

One characteristic of flash memory is that cells are erased in blocks to conserve time. In a conventional method, erasing a block means to return a block of cells to their "1" or "11" state, in other words restoring a block of cells to the "on" state, by lowering the threshold voltages on all the cells in the block at once.

Conventional mirror bit architecture is non-volatile and is suitable for long term code storage and other read-only applications. Due to the long programming time, conventional mirror bit architecture is not suitable for re-writable data storage, for example data storage arrays used in digital cameras.

In the field of flash memory, there is a constant desire to increase programming speed while maintaining efficient read speeds and the non-volatile nature of the data storage and keeping changes to fabrication processes to a minimum.

SUMMARY OF THE INVENTION

A method of utilizing a flash memory array for fast programming is disclosed. According to one embodiment, programming begins by accessing an array of flash memory cells in the "off" state, designated as the erased state. A first column page of cells in the array is selected, and a plurality of cells in the first page are selected for programming. The selected cells are programmed by lowering the threshold voltage on the selected cells. Once the first column page is programmed, a second column page of cells is selected and programmed. This selecting and programming is repeated, column by column, until the array is programmed.

BRIEF DESCRIPTION OF THE DRAWINGS

Prior Art

Prior Art

Prior Art

It is appreciated that FIGS. 1, 2, 3A, 3B, 4A, 4B, 6 and 7 are drawn for illustrative purposes only and are not drawn to scale.

DETAILED DESCRIPTION

Reference will now be made in detail to the preferred embodiments of the present invention, a method of utilizing a flash memory array for fast programming. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

The preferred embodiment of the present invention relates to dual bit flash memory arrays. The "00" state of a dual bit flash is designated as the erased state, and the "11" state is designated as the programmed state. In the preferred embodiment, programming begins with an array of dual bit flash memory cells in the "00," or erased state. According to the preferred embodiment, in the erased array the number of electrons trapped in the charge trapping layer is at the maximum, and therefore the threshold voltages on the cells are at their maximum.

Programming the memory cells in the preferred embodiment consists of lowering the threshold voltage on individual cells so that current can flow through the cells to reflect the "01," "10," and "11" states. The current required to lower the threshold voltage of a dual bit cell is typically 1-10 nA, significantly less than the current required to raise the threshold voltage (250 µA). In this method of programming, 20 k-200 k bits can be programmed at once, at a rate of 1 msec per page (2.5 kB-25 kB/msec). Put another way, a page according to the preferred embodiment of the present invention, contains 20 k-200 k bits.

Figure 1:
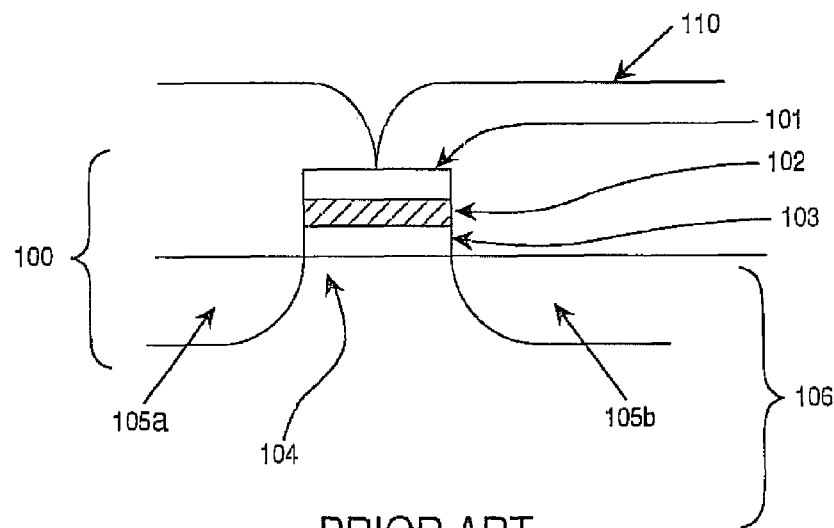
FIG. 1 is a cutaway view of a flash memory cell.
Prior Art
Figure 2:
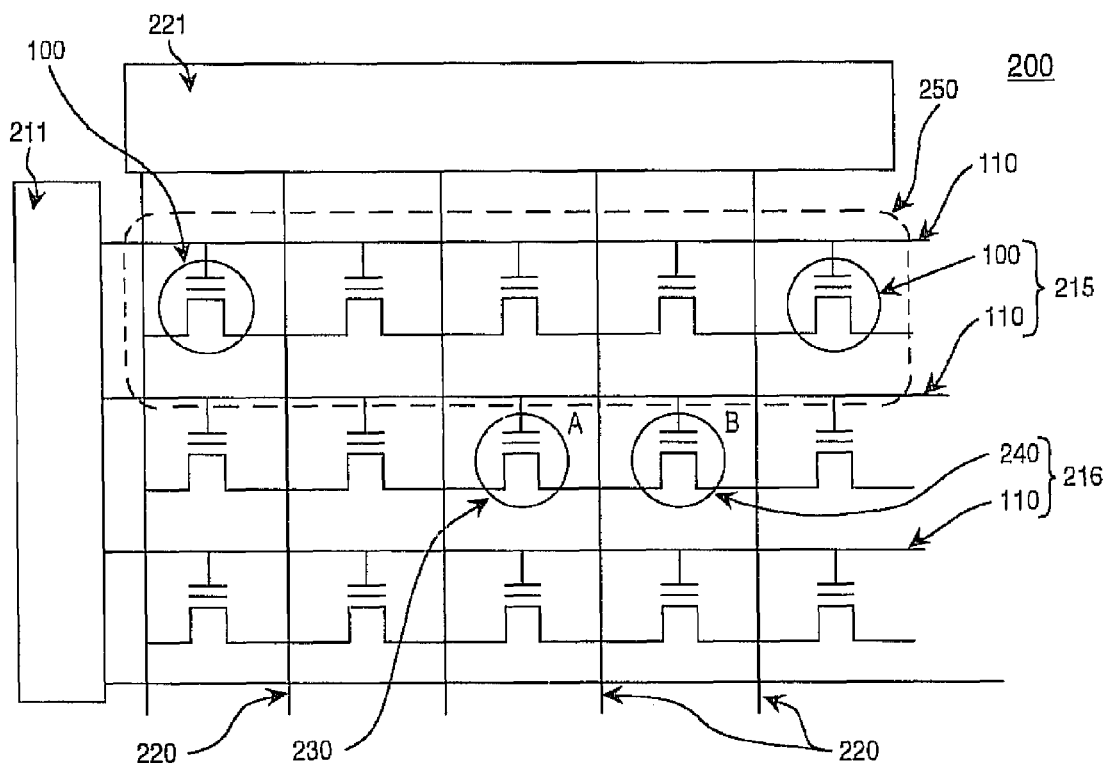
FIG. 2 is a diagram of a flash memory array.
Figure 3A:
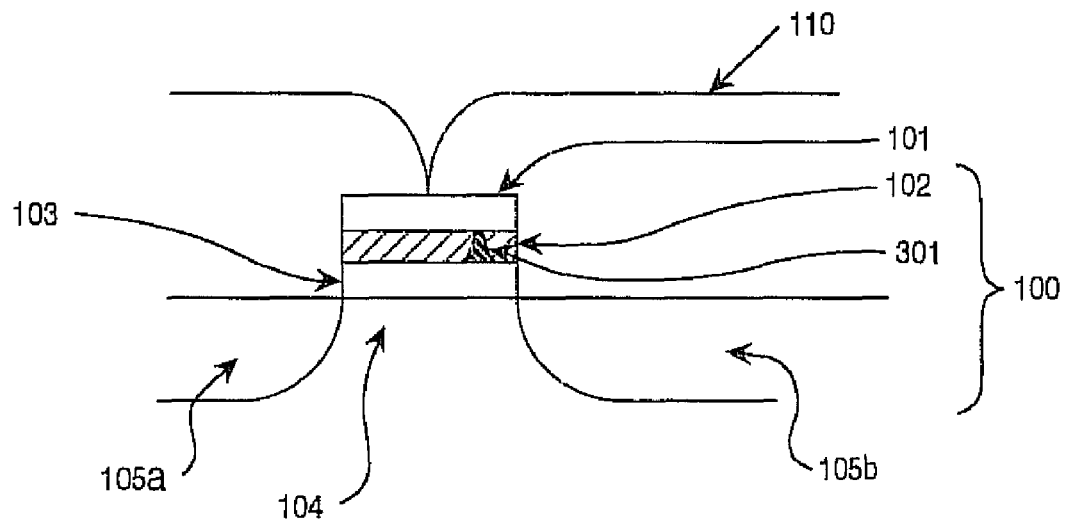
FIG. 3A is a cutaway view of a dual bit flash memory cell having one programmed bit.
Figure 3B:
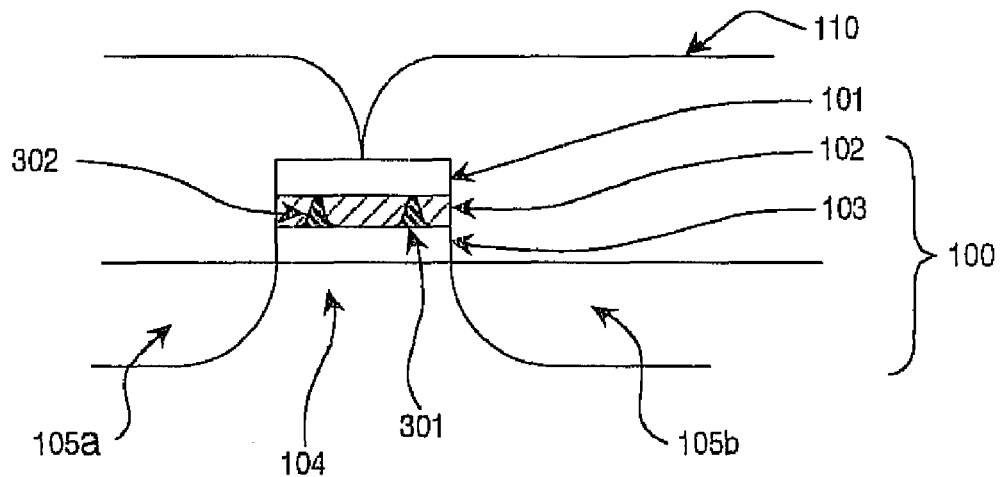
FIG. 3B is a cutaway view of a dual bit flash memory cell having both programmed bits.
Figure 4A:
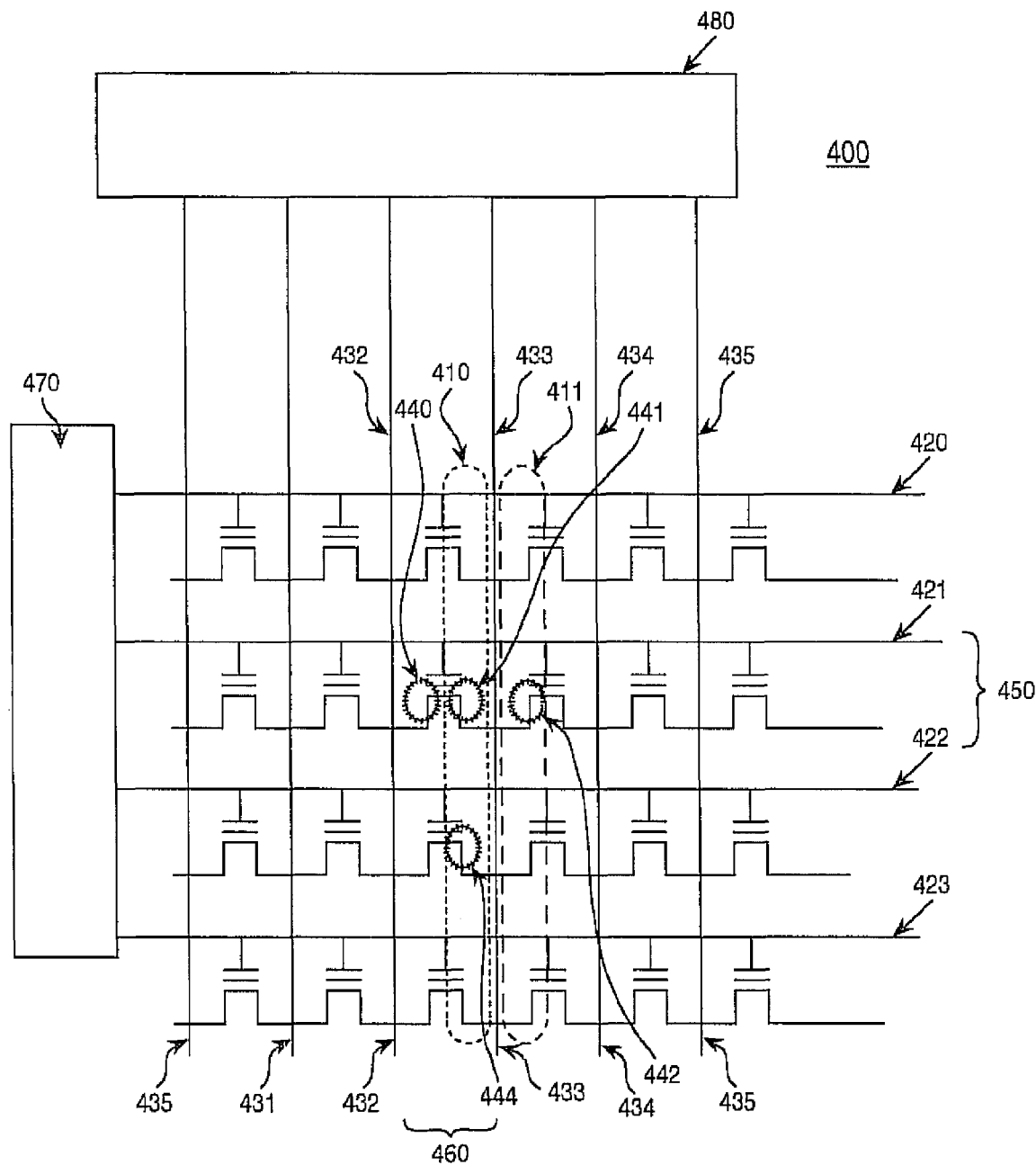
FIG. 4A is a diagram of a flash memory array architecture according to a preferred embodiment of the present invention.

When an operation is performed on a flash memory cell in an array, e.g. lowering the threshold voltage of the cell, the states of neighboring cells can be affected. Referring to FIG. 4A, for example when a first cell 441 is programmed by lowering the threshold voltage of the cell 441, the state of a second cell 444 along the column 460 of the first cell 441 is disturbed. The state of a third cell 442 along the row 450 of the first cell 441 is also disturbed. The disturbance on cells along the column 460 of the cell 441 being programmed according to a preferred embodiment of the present invention is typically greater than the disturbance on the cell 442 along the row 450 of the cell 441 being programmed in this fashion. If an array of flash memory cells were programmed row by row by lowering the threshold voltages on the cells, (i.e. the pages were oriented in the row direction) every time a cell in a column was programmed, every cell in that column would experience a disturbance.

Figure 4B:
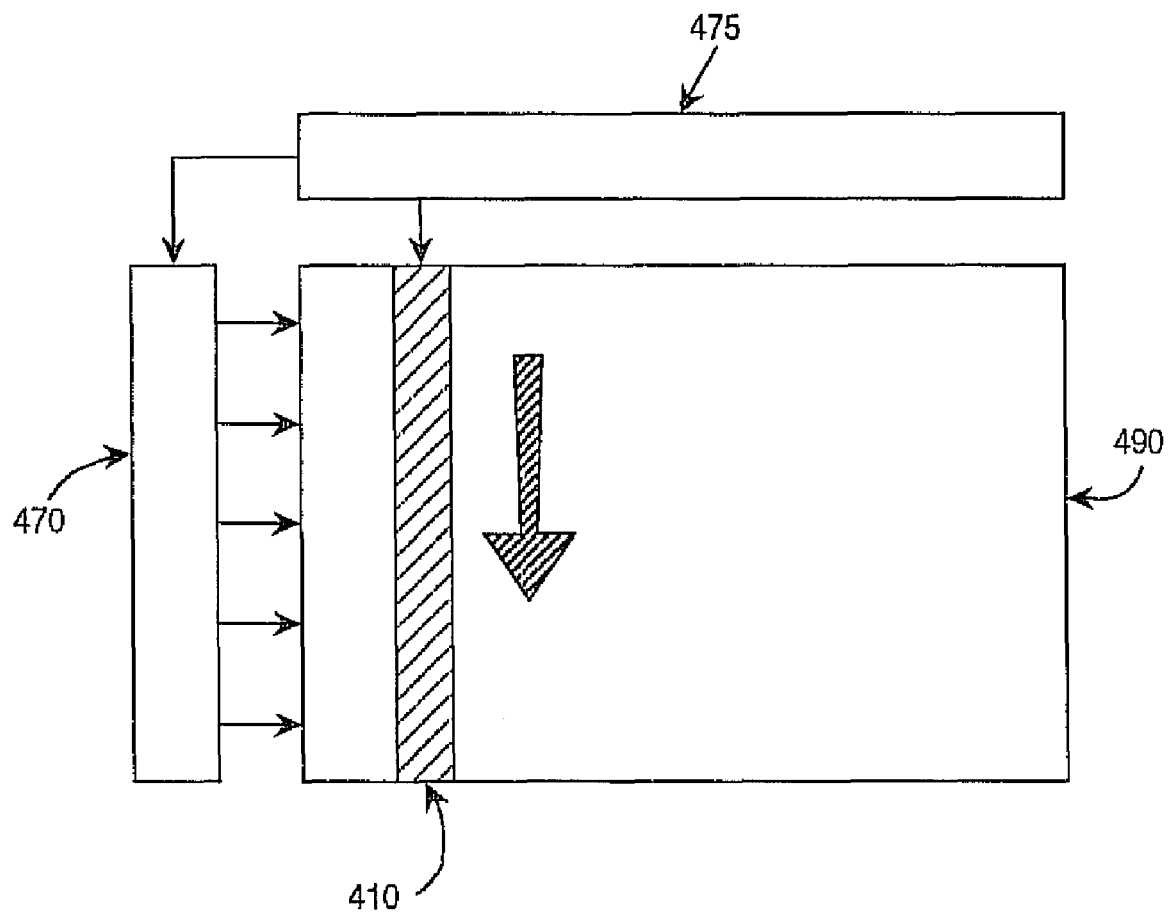
FIG. 4B is an illustration of page orientation by column, in accordance with embodiments of the present invention.

To limit the disturbance on cells along the column direction, a page 410 in an array 490 according to the preferred embodiment of the present invention is oriented in the column direction, as illustrated in FIG. 4B. An SRAM array 475 is equipped as a write buffer and instructs the word line buffer 470 to apply voltage to the word lines corresponding to selected bits in the page 410. The area of the write buffer 475 is approximately 0.16%-0.32% of the whole array 400 in embodiments of the present invention. This area penalty is not an obstacle in fabrication or employment of flash memory arrays.

According to this method, to program a page 410 of bits in a dual bit flash memory array 400, a program voltage (e.g. 5.5V) is applied to the bit line 433 corresponding to the selected page 410 of bits. A negative voltage (e.g. –6V) is applied to the word lines (e.g. 421 and 422) corresponding to selected bits 441 and 444 in the selected page 410. Word lines (e.g. 420 and 423) corresponding to unselected bits in the selected page 410 are allowed to float.

The program voltages are applied concurrently, and this configuration forces hot hole injection to occur, increasing the hole population on the charge trapping layers of the selected cells, and thereby lowering the threshold voltages of the selected cells. In a preferred embodiment, the charge trapping layer is an ONO (oxide-nitride-oxide) film. In other embodiments, other charge trapping films may be employed, such as OAO (oxide-aluminum-oxide) or OHO (oxide-hydrogen-oxide).

Figure 5:
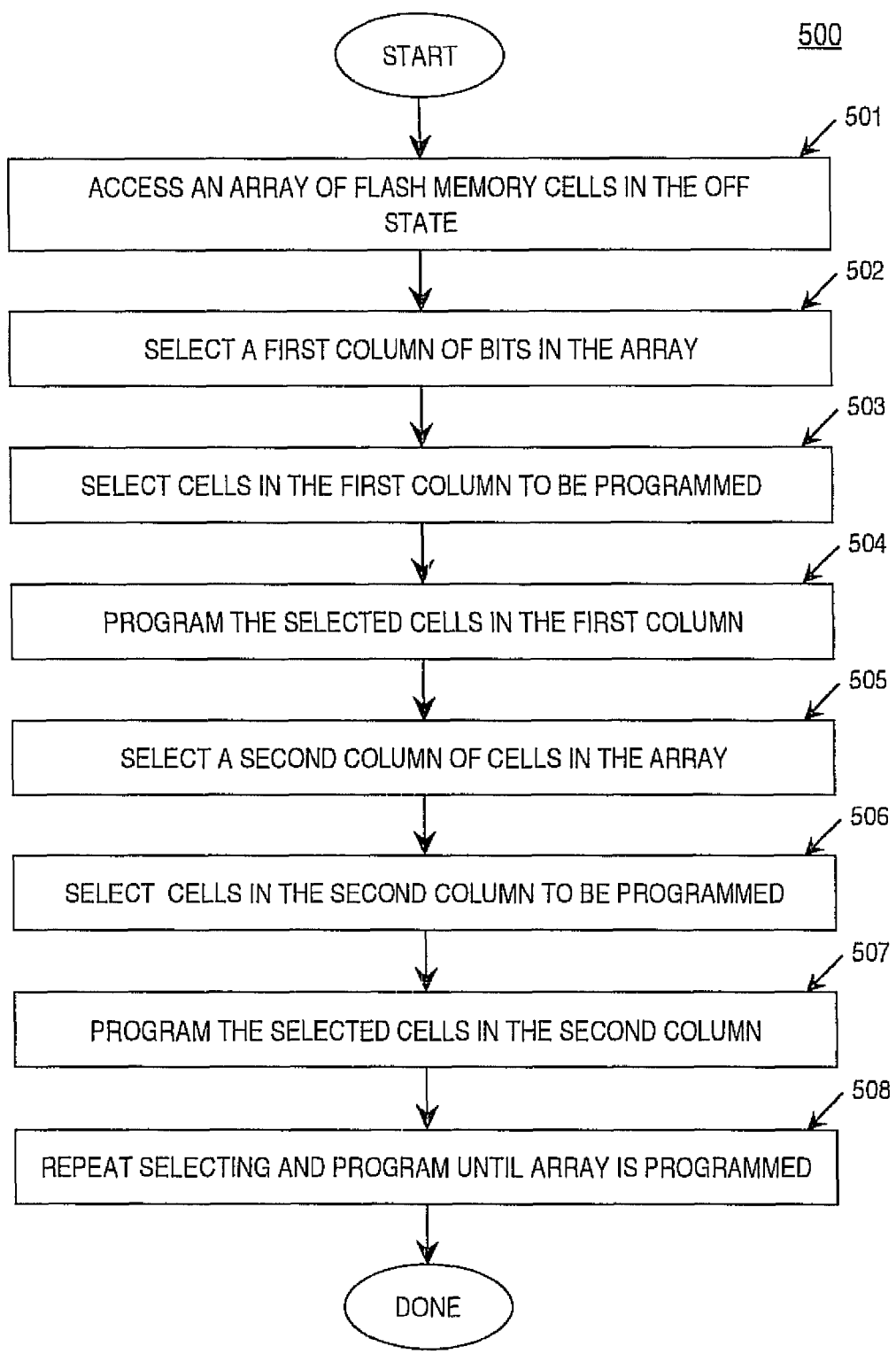
FIG. 5 is a flowchart illustrating a method of programming an array of flash memory cells in accordance with a preferred embodiment of the present invention.

FIG. 5 is a flowchart 500 illustrating a method of programming a flash memory array according to a preferred embodiment of the present invention. Initially, as in step 501, an array of erased flash memory cells is accessed, meaning the cells are in the "off" state. To program a cell according to the present invention means to turn the cell on. Proceeding to step 502, a first column of bits (the page 410 in FIG. 4) in the array of flash memory cells is selected for programming. A first plurality of bits within this column (441 and 444 in FIG. 4) are then identified for programming in step 503.

The next step 504 in the method depicted in FIG. 5 is to program the bits selected in step 503. According to the preferred embodiment of the present invention, programming is performed in the following way:

Referring to FIG. 4A, a negative voltage, for example –6V, is applied to the word lines 421 and 422 corresponding to the selected memory cells. The selection of the bits 441 and 444 to be programmed, as well as the application of this negative voltage is performed in a word line driver 470. The word lines 420 and 423 corresponding to the unselected memory cells are allowed to float.

Concurrent to the application of the negative voltage, a first positive voltage, for example 5.5V, is applied to the bit line 433 corresponding to the column 460 of cells containing the bits 441 and 444 to be programmed. The application of voltages to the bit lines, as well as the selection of bit lines for programming, is performed by a bit line driver 480. This configuration produces a phenomenon known as "hot hole injection," forcing holes into the charge trapping layers 102 of flash memory cells. In this manner, all bits in the selected page 410 are programmed simultaneously.

As step 505 indicates, once the first column page 410 is programmed, a second column page of bits is selected for programming, and the process is repeated. A second set of cells in the second page are selected for programming, step 506, and then the second set of selected bits are programmed. As step 508 indicates, the programming method depicted in flowchart 500 is repeated until all bits in the array are programmed.

According to a preferred embodiment of the present invention, a column page 410 is programmed in one simultaneous application of voltages. The disturb effect on cells corresponding to the page being programmed is eliminated. However, there is still the issue of disturbance in cells along the rows of selected bits being programmed. When one page 410 is being programmed, the state of a bit e.g. 442 in a subsequent page 411 that share a row 450 with a bit 441 in the page 410 being programmed can be disturbed.

In one embodiment, to limit this disturbance, an intermediate voltage is applied to an adjacent bit line 434. The adjacent bit line 434 accesses the cells in the subsequent page 411. The application of the intermediate voltage is performed concurrently with the programming of the selected page 410. The intermediate voltage is between the program voltage and 0, for example 4V. This intermediate voltage inhibits the lowering of the threshold voltage of the cells in the subsequent page 411. In other words, the application of the intermediate voltage inhibits hot hole injection from occurring in the subsequent page 411.

In one embodiment of the present invention, while one page is being written, bit lines that do not correspond to the page being written or the subsequent page are allowed to float.

According to an embodiment of the present invention, each program operation is followed by a program verify operation. Voltages are applied to programmed cells to verify that the threshold voltage is sufficiently lowered by the previous programming operation. If a cell verifies as not sufficiently programmed, a second program operation is performed on the cell. This is followed by a second verify operation, and so on until the cell verifies as sufficiently programmed. The time required for program verification according to this method is between 0.02 and 0.2 msec, and does not compromise the operation of the flash memory device.

Figure 6:
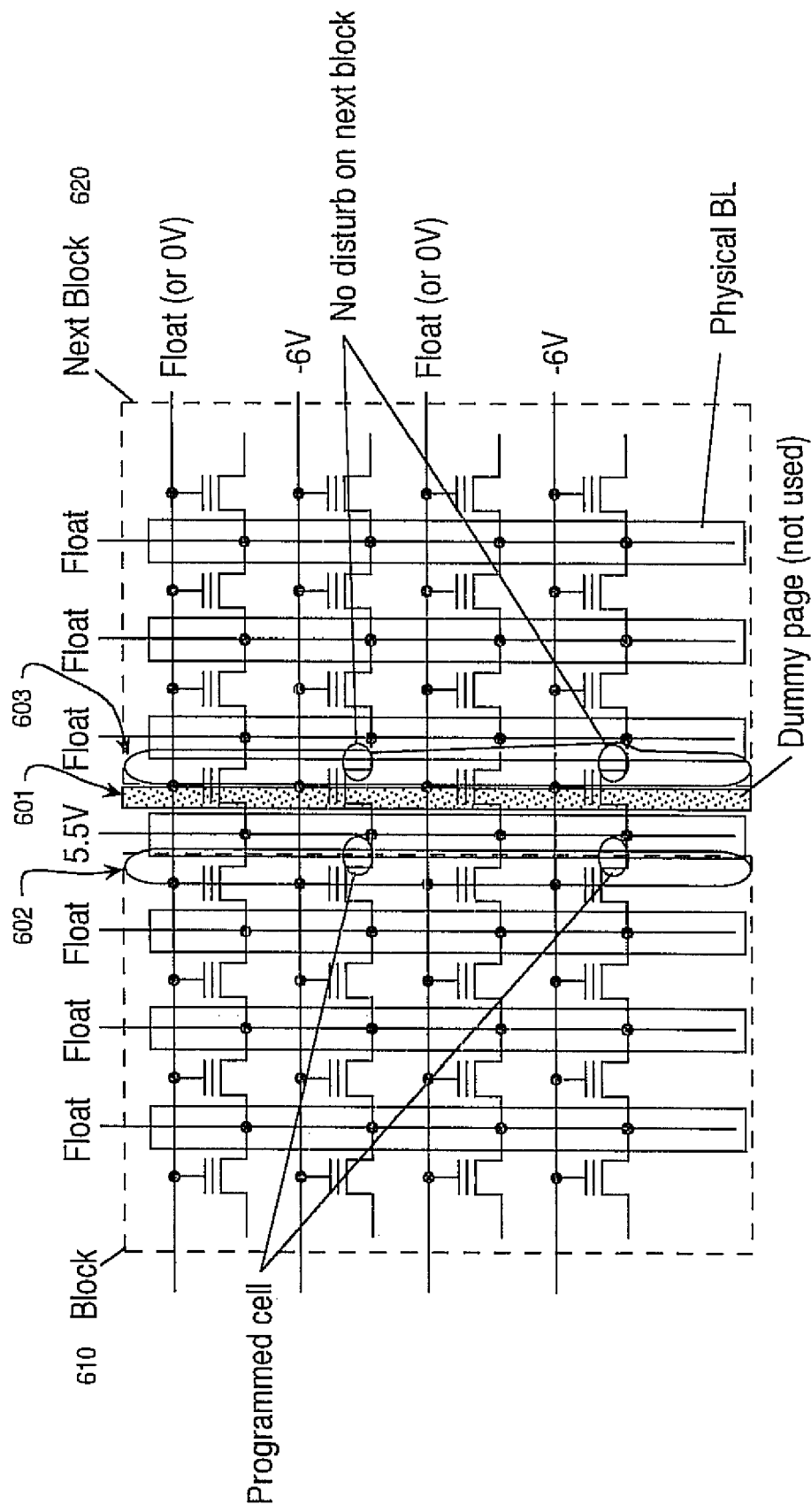
FIG. 6 is a diagram illustrating block architecture of a flash memory array according to embodiments of the present invention.

According to the preferred embodiment, erasing a flash memory cell consists of raising the threshold voltage on a cell until only a minimal current, or no current can flow through the cell. When a dual bit cell in an erased state according to the present invention is read, it is read as "00" (or "0" for a single bit flash memory cell). As with conventional methods, the preferred embodiment erases cells in blocks to conserve time. Referring to FIG. 6, a block 610 consists of multiple pages (columns of bits). As there are no physical borders between neighboring blocks 610 and 620, block size can be user-defined. In one embodiment, adjacent blocks 610 and 620 are separated by a dummy page 601. When the edge page 602 in one block 610 is programmed, there is no intermediate voltage applied to the subsequent page 601, which is called the dummy page. The dummy page 601 is not read during read operations, therefore disturbance on the cells in the dummy page 601 is inconsequential. Cells in the first page 603 of the next block 620 are buffered from the disturbing effects of programming the edge page 602 of the previous block 610.

Figure 7:
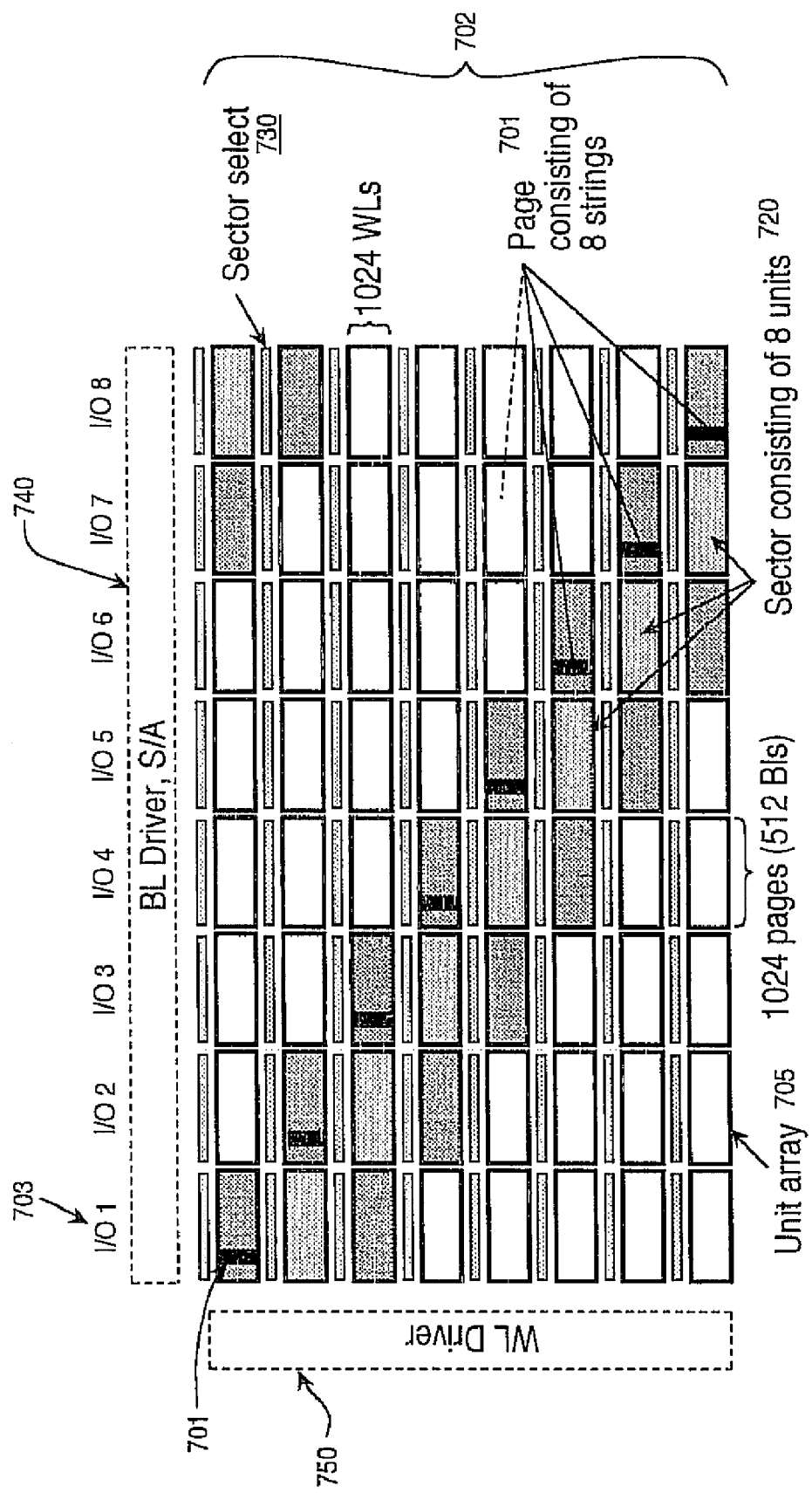
FIG. 7 depicts a possible array structure for a read operation, in accordance with an embodiment of the present invention.

A possible array structure according to a preferred embodiment of the present invention is illustrated in FIG. 7. FIG. 7 depicts an entire chip, including an array 702 of flash memory cells, a word line driver 750, and a bit line driver 740. In one embodiment, the bit line driver 740 has eight input/output (I/O) lines 703, each of which can receive 1 bit of information at a time. The eight I/O lines 703 can receive 1 bit simultaneously, therefore the array 702 in FIG. 7 can output 8 bits at once, in one embodiment. In other embodiments, the bit line driver 740 has more than eight I/O lines, e.g. 16 or 32 I/O lines. In those embodiments, the array 702 can output 16 or 32 bits at once. The array 702 is divided into units 705, with sector select components 730 situated between each unit 705 in the column direction. The sector select components 730 are controlled by the bit line driver 740. The sector select components 730 determine which units 705 to drive. One unit consists of 1024 word lines and 512 bit lines. Pages 701 are oriented in the column direction within each unit. A bit is read by applying a positive voltage to the word line corresponding to the bit, grounding one bit line corresponding to the bit, and applying a positive bias to the other bit line corresponding to the bit. The read data is sent up the I/O line 703 that corresponds to the unit within which the bit resides.

Figure 8:
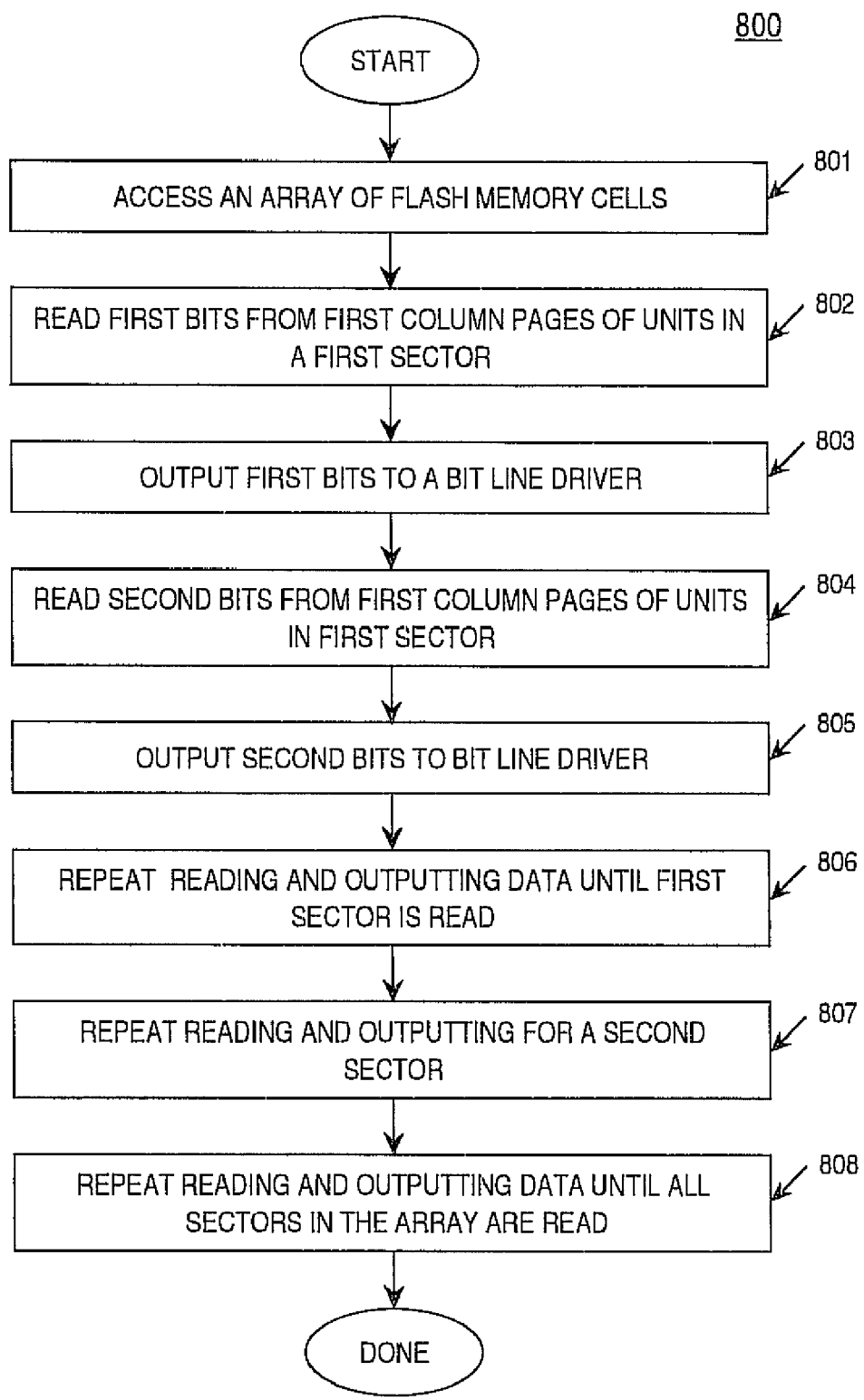
FIG. 8 is a flowchart illustrating a method of reading a flash memory array according to an embodiment of the present invention.

A read operation on an array depicted in FIG. 7 is described in flowchart 800 of FIG. 8. According to a preferred embodiment of the present in invention, in the read operation, once an array of flash memory cells is accessed (step 801), first data is read simultaneously from several units. In one embodiment, eight bits are read from eight units simultaneously, rendering an output of 8 bits. According to a preferred embodiment, the eight units being read simultaneously are situated diagonally adjacent one another, such that there is only one activated bit line and one activated word line per unit per read operation. Eight units being read simultaneously form a sector 720.

After the first bit of the first page (first column) of each unit in the sector are read (step 802 in flowchart FIG. 8), the word line driver 750 then ceases to apply read voltage to the first word line in each unit, the 8-bit output is received at the bit line driver 740 (step 803), and the word line driver 750 then shifts to apply read voltages to the second word line in each unit. The second bit down in the first column of each of the eight units is then read (step 804), and a second set of 8 bits is reported to the bit line driver 740 (step 805). This process repeats until each of the bits in the first column (first page) of each unit is read. The read process then continues with the first bit of the second column of each unit, and the second column (second page) of each unit is read, and so on until all bits in the sector are read (step 806). The process then repeats with a second sector (step 807), and so on until all bits in the array are read (step 808).

Figure 9:
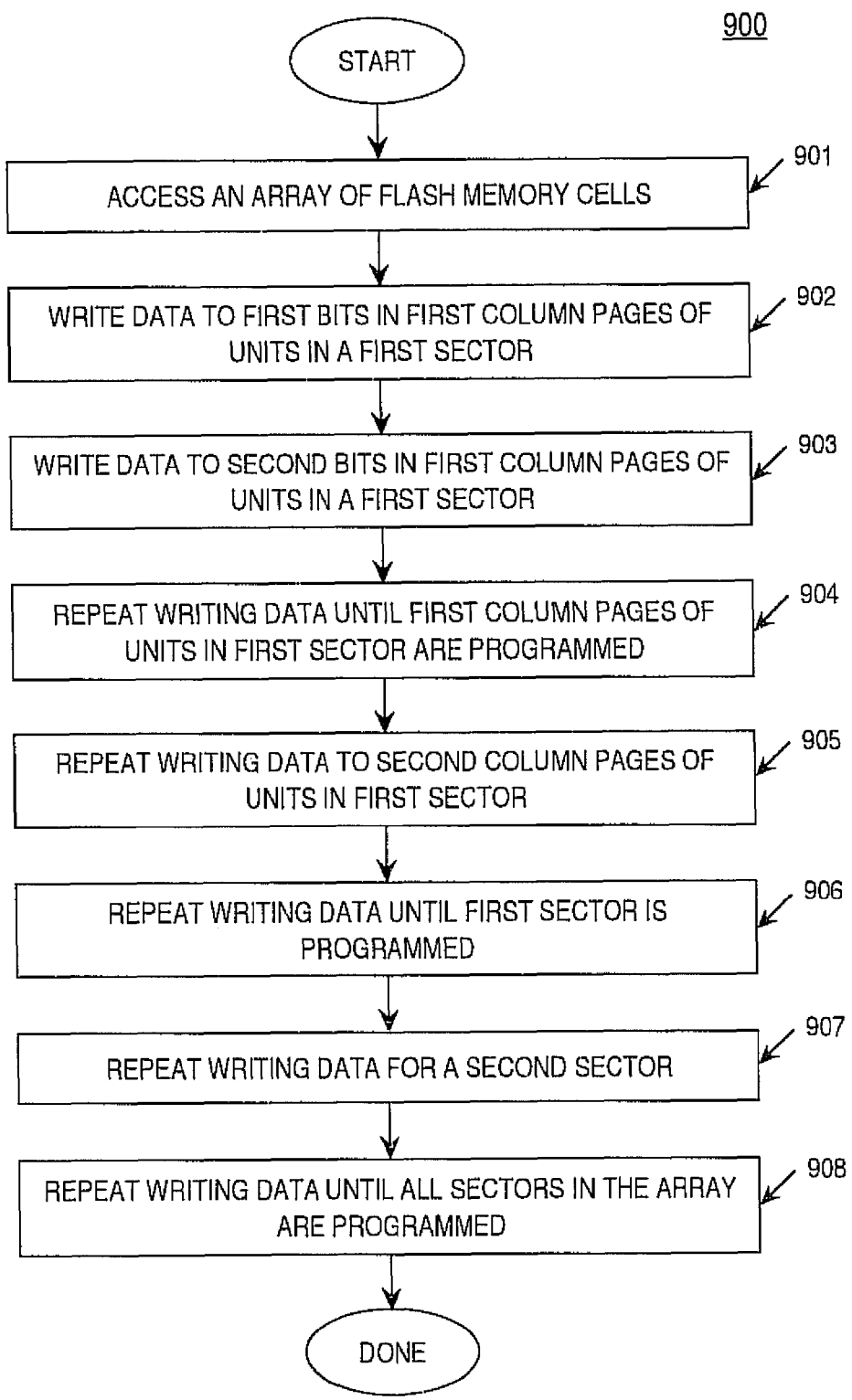
FIG. 9 is a flowchart illustrating a method of programming a flash memory array according to an embodiment of the present invention.

A program operation on an array depicted in FIG. 7 is described in flowchart 900 of FIG. 9. According to a preferred embodiment of the present invention, in the program operation, once an array of flash memory cells is accessed (step 901), first data is written to first bits in first column pages of units in a first sector. According to a preferred embodiment, eight bits are written, one bit per page, to first column pages in 8 units in the first sector. The eight units being programmed simultaneously are situated diagonally adjacent one another, such that there is only one activated bit line and one activated word line per unit per program operation. Referring to FIG. 7, the eight units being programmed simultaneously form sector 720.

After the first bit of the first page (first column) of each unit in the sector are programmed (step 902 in flowchart FIG. 9), the word line driver 750 then ceases to apply program voltage to the first word line in each unit, the 8-bit, and the word line driver 750 then shifts to apply program voltages to the second word line in each unit. The second bit down in the first column of each of the eight units is then programmed (step 903). This process repeats until each of the bits in the first column (first page) of each unit is programmed (step 904). The program process then continues with the first bit of the second column of each unit (step 905), and the second column (second page) of each unit is programmed, and so on until all bits in the sector are programmed (step 906). The program process then repeats with a second sector (step 907), and so on until all bits in the array are programmed (step 908).

An alternative embodiment of the present invention consists of programming an array of single bit flash memory cells by lowering the threshold voltages on the cells one column at a time. Single bit flash memory arrays programmed according to the alternative embodiment of the present invention can also be read in the column-by-column manner described in FIG. 8, and programmed in the column-by-column manner described in FIG. 9.

A flash memory array according to the preferred embodiment of the present invention, read in the method illustrated in FIG. 8 and programmed according to the method depicted in FIG. 9, exhibits sufficient read speed for data or code storage. Due to the fast programming time and sufficient read time, mirror bit flash memory arrays programmed according to the present embodiment are superior to conventional flash memory architectures for data storage in devices such as digital cameras. The preferred embodiment of the present invention can be employed to program flash memory arrays fabricated by conventional processes. No new fabrication techniques or masks are required to implement the preferred embodiment of the present invention.

The preferred embodiments of the present invention, a fast programming method for flash memory arrays, is thus described. While the present invention has been described in particular embodiments, it should be appreciated that the present invention should not be construed as limited by such embodiments, but rather construed according to the below claims.

What is claimed is:

1. A method of reading an array of flash memory cells, wherein said array comprises a plurality of sectors of said memory cells, wherein a sector comprises a plurality of units of said memory cells, wherein a unit comprises a plurality of columns, wherein a column comprises cells, wherein a cell comprises a bit, said method comprising:

reading first data from a first sector of units, wherein said first data comprises a first bit in a first column page from a first unit in said first sector;

outputting said first data to a bit line driver;

repeating said reading and outputting for second data from said first sector, wherein said second data comprises a second bit in said first column page from said first unit in said first sector;

repeating said reading and said outputting of data until said first sector is read.

2. The method recited in claim 1 further comprising repeating said reading and said outputting data for a second sector of units.

3. The method recited in claim 2 further comprising repeating said reading and outputting strings for sectors until said array is read.

4. The method of claim 1 wherein said unit comprises 8 bits.

5. The method of claim 4 wherein said first data comprises:
a first bit of a first page of a first unit in said first sector;
a first bit of a first page of a second unit in said first sector;
a first bit of a first page of a third unit in said first sector;
a first bit of a first page of a fourth unit in said first sector;
a first bit of a first page of a fifth unit in said first sector;
a first bit of a first page of a sixth unit in said first sector;
a first bit of a first page of a seventh unit in said first sector; and
a first bit of a first page of an eighth unit in said first sector.

6. The method of claim 1 wherein said unit comprises 16 bits.

7. The method of claim 1 wherein a flash memory cell comprises a control gate accessed by a word line, a drain region accessed by a first bit line, source region accessed by a second bit line, and a channel region, wherein a method of reading said memory cell is read according to the following:
applying a first voltage to said word line;
applying a second voltage to said first bit line;
grounding said second bit line, wherein said applying said first and second voltages and said grounding said second bit line are concurrent; and
measuring a current through said channel, wherein if said measured current is greater than a reference current, said cell reads as programmed, and wherein if said measured current is less than said reference current, said cell reads as erased.

8. The method of claim 1 wherein said first voltage is 3V~5V, and said second voltage is 1V~2V.

9. The method of claim 1 wherein said array further comprises a sector select component, wherein said sector select component determines a sector to be read.

* * * * *